(12) United States Patent
Sawayama (10) Patent No.: US 8,525,907 B2
(45) Date of Patent: Sep. 3, 2013

(54) SOLID-STATE IMAGE SENSOR AND IMAGING SYSTEM

(75) Inventor: Tadashi Sawayama, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 213 days.

(21) Appl. No.: 13/052,237

(22) Filed: Mar. 21, 2011

(65) Prior Publication Data

US 2011/0242350 A1    Oct. 6, 2011

(30) Foreign Application Priority Data

Apr. 6, 2010  (JP) ................................ 2010-088192
Feb. 9, 2011  (JP) ................................ 2011-026532

(51) Int. Cl.
*H04N 5/335*    (2011.01)

(52) U.S. Cl.
USPC ........................... 348/294; 348/272; 348/308

(58) Field of Classification Search
USPC ................ 348/272, 281, 282, 294, 302, 306, 348/307, 308, 309, 310, 311; 257/288, 290, 257/291
See application file for complete search history.

(56) References Cited

U.S. PATENT DOCUMENTS

| | | | |
|---|---|---|---|
| 5,537,146 A * | 7/1996 | Tohyama | 348/311 |
| 5,688,365 A * | 11/1997 | Ogoshi | 438/736 |
| 6,903,322 B2 | 6/2005 | Nakashima | 250/208.1 |
| 7,666,704 B2 * | 2/2010 | Suzuki et al. | 438/69 |
| 8,300,128 B2 * | 10/2012 | Toumiya | 348/294 |
| 2004/0004668 A1 | 1/2004 | Namazue et al. | |
| 2004/0251395 A1 | 12/2004 | Takahashi et al. | |
| 2007/0172970 A1 | 7/2007 | Uya | 438/22 |
| 2008/0251873 A1 * | 10/2008 | Kasano et al. | 257/432 |
| 2011/0115953 A1 | 5/2011 | Sawayama et al. | 348/265 |

FOREIGN PATENT DOCUMENTS

| | | |
|---|---|---|
| EP | 1 341 235 A2 | 9/2003 |
| JP | 2001-284566 A | 10/2001 |
| JP | 2003-224249 A | 8/2003 |
| JP | 2006-049825 A | 2/2006 |
| JP | 2007-201091 A | 8/2007 |
| JP | 2008-091800 | 4/2008 |

OTHER PUBLICATIONS

European Search Report dated Jul. 27, 2012, in related corresponding European Patent Application No. 11159133.5.
Chinese Office Action dated Dec. 18, 2012, issued in counterpart Chinese Application No. 20110079810.7, and English-language translation thereof.

* cited by examiner

*Primary Examiner* — Tuan Ho
*Assistant Examiner* — Peter Chon
(74) *Attorney, Agent, or Firm* — Fitzpatrick, Cella, Harper & Scinto (57) ABSTRACT

A solid-state image sensor including photoelectric conversion elements, comprises a first insulating film arranged on a substrate and having openings arranged on the respective elements, insulator portions having a refractive index higher than that of the first insulating film and arranged in the respective openings, a second insulating film arranged on upper surfaces of the insulator portions and an upper surface of the first insulating film, and a third insulating film having a refractive index lower than that of the second insulating film and arranged in contact with an upper surface of the second insulating film, wherein letting $\lambda$ be a wavelength of entering light, n be the refractive index of the second insulating film, and t be a thickness of the second insulating film in at least part of a region on the upper surface of the first insulating film, a relation $t < \lambda/n$ is satisfied.

9 Claims, 7 Drawing Sheets

SOLID-STATE IMAGE SENSOR AND IMAGING SYSTEM

BACKGROUND OF THE INVENTION

1. Field of the Invention

The present invention relates to a solid-state image sensor and an imaging system having the solid-state image sensor and, more particularly, to the pixel structure of the solid-state image sensor.

2. Description of the Related Art

As solid-state image sensors used in imaging systems such as a digital camera and camcorder are gaining smaller sizes and more pixels, the pixel size shrinks rapidly. A smaller pixel size leads to a smaller area of the light receiving portion of a photoelectric conversion element in the pixel, decreasing the sensitivity of the photoelectric conversion element. To suppress the decrease in the sensitivity of the photoelectric conversion element, a technique of forming an on-chip microlens on the light incident surface of a pixel has already been in practical use. Recently in some arrangements, a light waveguide is formed between a microlens and a photoelectric conversion element to collect light using total reflection of light. Japanese Patent Laid-Open No. 2007-201091 discloses a structure in which a light waveguide is formed by filling a through hole 41 formed in a planarizing layer with a high-refractive-index material, and covering the upper surface of the planarizing layer with a high-refractive-index material.

However, in the structure disclosed in Japanese Patent Laid-Open No. 2007-201091, light propagates while being reflected by the upper and lower surfaces of the high-refractive-index material layer arranged on the planarizing layer between adjacent light waveguides. As a result, light may enter the light waveguide and further the photoelectric conversion element. This may cause mixture of colors or a noise component.

SUMMARY OF THE INVENTION

The present invention provides a technique that is advantageous to reducing noise such as mixture of colors.

The first aspect of the present invention provides a solid-state image sensor including a semiconductor substrate containing a plurality of photoelectric conversion elements, the sensor comprising a first insulating film which is arranged on the semiconductor substrate and has a plurality of openings, each of the plurality of openings being arranged on one of the plurality of the photoelectric conversion elements, a plurality of insulator portions which have a refractive index higher than a refractive index of the first insulating film, each of the plurality of insulator portions being arranged in one of the plurality of openings, a second insulating film which is arranged on upper surfaces of the plurality of insulator portions and an upper surface of the first insulating film, and a third insulating film which has a refractive index lower than a refractive index of the second insulating film and is arranged in contact with an upper surface of the second insulating film, wherein letting λ be a wavelength of light entering the plurality of insulator portions, n be the refractive index of the second insulating film, and t be a thickness of the second insulating film in at least part of a region on the upper surface of the first insulating film, a relation t<λ/n is satisfied.

The second aspect of the present invention provides an imaging system comprising a solid-state image sensor defined as the first aspect of the present invention, and a signal processing unit which processes a signal obtained by the solid-state image sensor.

Further features of the present invention will become apparent from the following description of exemplary embodiments with reference to the attached drawings.

DESCRIPTION OF THE EMBODIMENTS

Preferred embodiments of the present invention will now be described with reference to the accompanying drawings.

First Embodiment

References which disclose a technique of forming a light waveguide are Japanese Patent Laid-Open Nos. 2003-224249 and 2006-049825. Japanese Patent Laid-Open No. 2003-224249 discloses a structure which increases the light collection efficiency by tapering a waveguide to widen the opening at its upper portion. Japanese Patent Laid-Open No. 2006-049825 discloses a structure in which a lens is further formed on a light waveguide to converge light on it.

However, in the structure of Japanese Patent Laid-Open No. 2003-224249, light obliquely entering a condenser lens at the top or light entering the space between adjacent condenser lenses becomes one which does not enter the opening of the light waveguide having a multistage opening. The light which does not enter the opening of the light waveguide enters an adjacent element portion, causing mixture of colors or a noise component. In the structure of Japanese Patent Laid-Open No. 2006-049825, a condenser lens is formed integrally with a light waveguide using the same material at the upper portion of the opening of the light waveguide. However, light which obliquely enters the lens and cannot be converged to the light waveguide enters an adjacent element portion. The light which enters the adjacent element portion becomes a noise component to decrease the resolution or, in a color solid-state image sensor, generate mixture of colors.

The first embodiment provides a solid-state image sensor capable of efficiently capturing light and suppressing incidence of light on an adjacent photoelectric conversion element, and an imaging system having the solid-state image sensor.

<Example of Structure of Solid-State Image Sensor According to First Embodiment>

Figure 1:
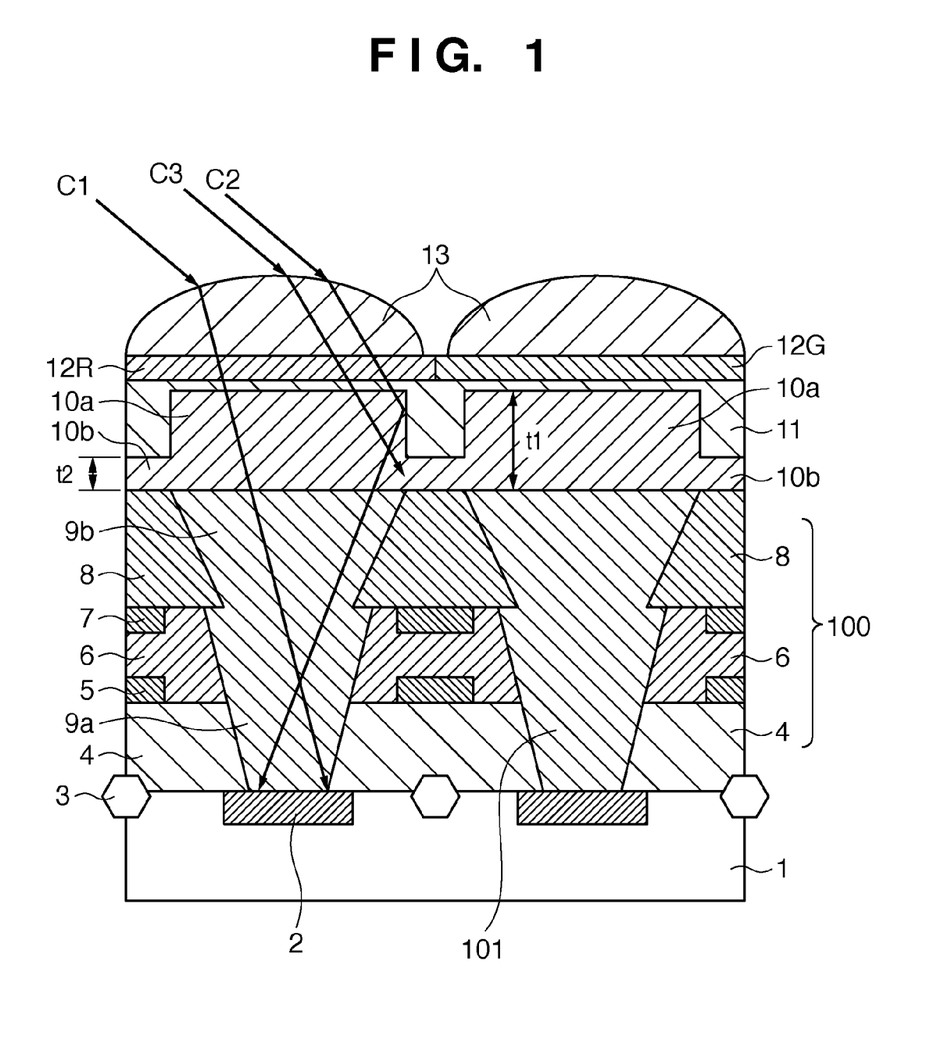
FIG. 1 is a sectional view exemplifying the structure of a solid-state image sensor according to the first embodiment.

FIG. 1 is a schematic sectional view showing a solid-state image sensor according to the first embodiment. The first embodiment is related to a CMOS solid-state image sensor. FIG. 1 shows the section of two pixels. A plurality of pixels as shown in FIG. 1 are arrayed two-dimensionally and used in an imaging system such as a digital camera or camcorder. The example of the imaging system is described later with reference to FIG. 4B.

In FIG. 1, a photoelectric conversion element 2 and element isolation region 3 are formed in the upper surface of a semiconductor substrate 1. A first insulating film 100 having an opening 101 arranged on the photoelectric conversion element 2 is arranged on the semiconductor substrate 1 in which the photoelectric conversion element 2 is formed. In the example shown in FIG. 1, the first insulating film 100 includes a first insulating layer 4, second insulating layer 6, and third insulating layer 8. The first insulating layer 4, second insulating layer 6, and third insulating layer 8 respectively have openings that form the opening 101. More specifically, the first insulating layer 4 having an opening is formed on the photoelectric conversion element 2. A first wiring layer 5, and the second insulating layer 6 which covers the first wiring layer 5 and has an opening above the photoelectric conversion element 2 are formed on the first insulating layer 4. A second wiring layer 7 is formed in the second insulating layer 6. The second wiring layer 7 has a damascene structure. The third insulating layer 8 which covers the second insulating layer 6 and has an opening above the photoelectric conversion element 2 is formed. The openings of the first insulating layer 4, second insulating layer 6, and third insulating layer 8 which correspond to the photoelectric conversion element 2 have a tapered shape to increase the area with distance from the photoelectric conversion element 2. The openings are filled with an insulator serving as a high-refractive-index portion formed from a material higher in refractive index than the constituent materials of the first insulating layer 4, second insulating layer 6, and third insulating layer 8. The insulator forms light waveguides 9a and 9b.

Passivation films 10a and 10b are arranged on the light waveguide 9b as the second insulating film formed from a material having a refractive index equal to or higher than that of the high-refractive-index portion. In this case, let λ be the wavelength of light entering the light waveguide (insulator), and n be the refractive index of the passivation film. Letting t1 be the thickness of the passivation film 10a, all or at least part of the region on the upper surface of the light waveguide is covered with the passivation film 10a whose thickness satisfies t1>λ/n. A region of the upper surface of the light waveguide that is covered with the passivation film 10a is defined as the first region. Also, letting t2 be the thickness of the passivation film 10b, at least part of the region on the upper surface of the first insulating film 100 (or the third insulating layer 8) positioned between the passivation films 10a is covered with the passivation film 10b whose thickness satisfies t2<λ/n. A region of the upper surface of the first insulating film 100 (or the third insulating layer 8) that is covered with the passivation film 10b is defined as the second region.

In the example shown in FIG. 1, the passivation films 10a and 10b are formed from the same film at the predetermined thicknesses t1 and t2, respectively. A planarizing layer 11 as the third insulating film formed from, for example, a transparent polymer resin having a refractive index of 1.5 is arranged on the passivation films 10a and 10b. Further, a red color filter layer 12R and green color filter layer 12G each formed from, for example, a transparent polymer resin having a refractive index of 1.55 are arranged on the planarizing layer 11 in correspondence with pixels. On-chip microlenses 13 formed from, for example, a transparent polymer resin having a refractive index of 1.6 are arranged on the color filter layers 12R and 12G. Needless to say, the color filter layer may be a blue color filter layer 12B or a color filter layer of a complementary color or the like. Hence, the color filter layer exists above the passivation film and below the microlens. Note that a planarizing layer may be further formed on the color filter layer. The above-described relations t1>λ/n and t2<λ/n are preferably satisfied in the entire band of light which passes through the color filter layer and enters the light waveguide (insulator).

(Example of Material of Each Element)

As the photoelectric conversion element 2, a photodiode having a P-N junction or PIN junction, a phototransistor, or the like is available. When light enters the semiconductor junction of such an element, the incident light causes photoelectric conversion, generating charges. The element isolation region 3 around each photoelectric conversion element 2 is formed by a field oxide film formed by selective oxidation, a diffusion layer for junction isolation, a buried element isolation method, or the like. Note that the element isolation region 3 may achieve isolation by impurity diffusion using a PD junction. The first insulating layer 4 covers each photoelectric conversion element 2 and the element isolation region 3. Note that, for example, a gate insulating film and gate electrode may be interposed between the semiconductor substrate 1 and the first insulating layer 4. The first wiring layer 5 has a wiring pattern. The materials of the first insulating layer 4, second insulating layer 6, and third insulating layer 8 suffice to be transparent materials capable of transmitting light which is absorbed in the photoelectric conversion element 2 and converted into an electrical signal. For example, most solid-state image sensors are used to detect visible or infrared light, so the materials suffice to transmit these light components. The first insulating layer 4, second insulating layer 6, and third insulating layer 8 adopt an inorganic or organic insulator generally used as an electrical insulating layer or passivation layer. Examples of the materials of the first insulating layer 4, second insulating layer 6, and third insulating layer 8 are silicon oxide or materials each prepared by doping phosphorus, boron, fluorine, carbon, or the like in silicon oxide. The first wiring layer 5 and second wiring layer 7 may have aluminum patterns or copper patterns formed by a damascene process. Examples of the material of the high-refractive-index portion which form the light waveguides 9a and 9b are silicon nitride having a refractive index of 2.0 and silicon oxynitride having a refractive index of 1.8. Note that a contact plug and via plug (neither is shown) are arranged in the first insulating layer 4 and second insulating layer 6.

<Example of Photoelectric Conversion Element Manufacturing Process According to First Embodiment>

FIGS. 2A to 2D are sectional views, respectively, showing manufacturing steps in forming a light waveguide 9. Note that the steps of forming a element in the substrate, a first insulating layer 4, second insulating layer 6, first wiring layer 5, second wiring layer 7, contact plug, and via plug on a semiconductor substrate 1 are well known, and a description thereof will be omitted.

Figure 2A:
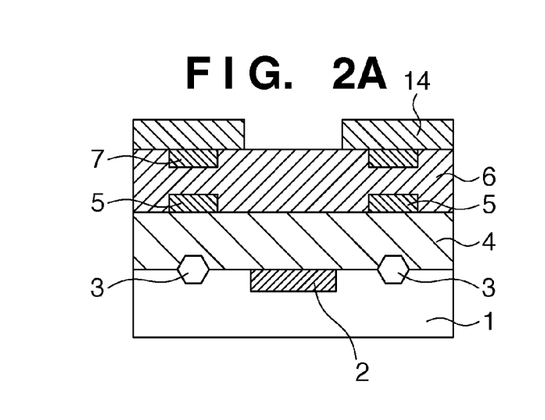
FIGS. 2A to 2D are sectional views, respectively, exemplifying steps in manufacturing the solid-state image sensor of FIG. 1.
Figure 2B:
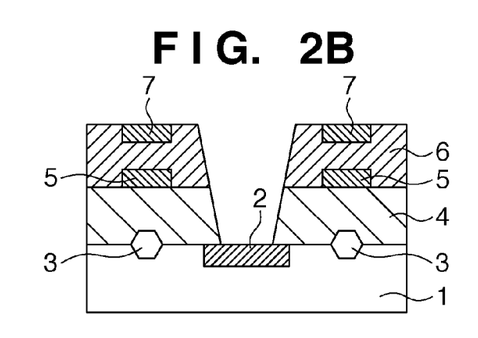

In FIG. 2A, after forming a first wiring layer 5 and second wiring layer 7, a photoresist is applied, and a photoresist pattern 14 is formed from the photoresist using a patterning technique in order to form the light waveguide 9a. Then, the second insulating layer 6 and first insulating layer 4 are etched by plasma etching. By this etching, openings corresponding to the photoelectric conversion element 2 are formed in the second insulating layer 6 and first insulating layer 4 and extend through them. Thereafter, the photoresist pattern 14 is removed, obtaining a structure in FIG. 2B. When the second insulating layer 6 is made of plasma silicon oxide and the first insulating layer 4 is made of BPSG, plasma etching is executed using a CF-based gas typified by $C_4F_8$ or $C_5F_8$, $O_2$, and Ar. Depending on etching conditions, the second insulating layer 6 and first insulating layer 4 can also be etched into a tapered shape in which the opening area at the lower portion is smaller than that at the upper portion, as shown in FIG. 2B. However, the opening is not always limited to the tapered shape as shown in FIG. 2B.

Figure 2C:
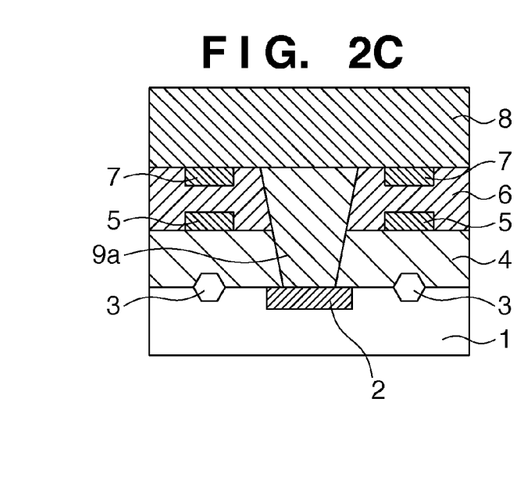

In FIG. 2B, a high-refractive-index material (insulator) is filled, forming a high-refractive-index portion, that is, a first light waveguide 9a in FIG. 2C. For example, the opening is filled with silicon nitride having a refractive index of 2.0 or silicon oxynitride having a refractive index of 1.8 by high-density plasma CVD, or a material having a high refractive index of 1.7 by spin coating. After filling the high-refractive-index material, the upper portion may be planarized using resist etch-back or CMP, as needed. Further, plasma silicon oxide is deposited as the third insulating layer 8, obtaining a structure in FIG. 2C.

In FIG. 2C, a high-refractive-index portion, that is, a second light waveguide 9b is formed by photoresist patterning, etching, and filling with a high-refractive-index material (insulator), similar to the first light waveguide 9a. The opening of the second light waveguide 9b serves as that of the third insulating layer 8. At this time, the taper angles of the first light waveguide 9a and second light waveguide 9b toward the photoelectric conversion element may be equal or different. The high-refractive-index portions of the first light waveguide 9a and second light waveguide 9b are preferably formed from materials having the same refractive index to reduce reflection at the interface between these two high-refractive-index portions. However, the refractive indices may not be equal. If the refractive indices of these two high-refractive-index portions are greatly different from each other, an antireflection film may be arranged at the interface between the first light waveguide 9a and the second light waveguide 9b.

After forming the light waveguide 9b, a passivation film is formed from plasma silicon nitride having a refractive index of 2.0 or plasma silicon oxynitride having a refractive index of 1.8. Then, a photoresist is applied to form a passivation film at the thickness t1 in all or part of the region on the light waveguide 9b and form it at the thickness t2 in the remaining region. The passivation film is etched by plasma etching to have a desired thickness. This state is a structure shown in FIG. 2D.

Figure 2D:
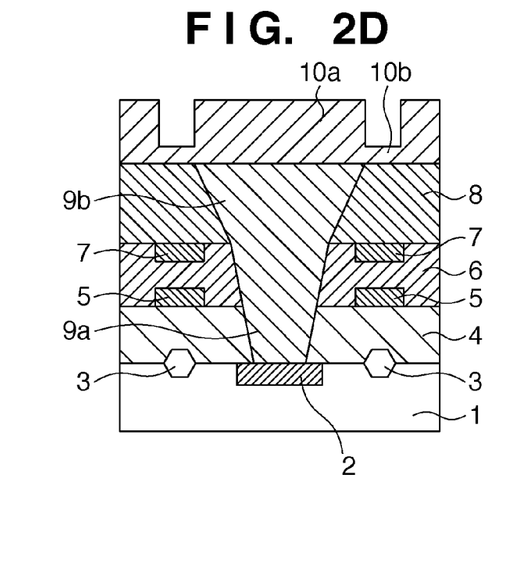

As the passivation film forming method, for example, a passivation film is formed on the entire surface to have the thickness t1, and is etched in the second region using the photoresist pattern as the mask of the first region, obtaining passivation films having the thicknesses t1 and t2. Passivation films having the thicknesses t1 and t2 can also be obtained by forming a passivation film thicker than the thickness t1, and then performing desired photoresist patterning and etching. Further, passivation films may be formed from two different films. For example, after forming a film from plasma silicon oxynitride to have the thickness t2, a film may be formed from plasma silicon nitride to have the thickness t1, and the plasma silicon nitride film may be patterned.

The light waveguides 9a and 9b have interfaces between the first to third insulating layers and the high-refractive-index materials. Thus, light entering the insides of the light waveguides 9a and 9b is totally reflected by the side surface according to Snell's law. For example, the high-refractive-index material of the light waveguides 9a and 9b is a plasma SiN film having a refractive index of 2.0. The materials which form the first insulating layer 4, second insulating layer 6, and third insulating layer 8 are BPSG (BoroPhosphoSilicate Glass) having a refractive index of 1.46, SiO (Silicon Oxide) having a refractive index of 1.46, and SiO (Silicon Oxide) having a refractive index of 1.46, respectively. In this case, for light which enters the side walls of the light waveguides 9a and 9b at an incident angle of 46.9° or more, the light is totally reflected by the side walls of the light waveguides 9a and 9b. The light totally reflected by the side wall finally enters the photoelectric conversion element 2. By forming the light waveguides 9a and 9b, light can effectively enter the photoelectric conversion element 2, contributing to photoelectric conversion.

The passivation films 10a and 10b are formed to cover the upper portion of the light waveguide and other portions. The upper portion of the light waveguide 9b is covered with the passivation film 10a formed from a plasma silicon nitride film having the thickness t1 and a refractive index of 2.0. The remaining portion except for the upper portion of the light waveguide is covered with the passivation film 10b formed from a plasma silicon nitride film having the thickness t2 and a refractive index of 2.0. The planarizing layer 11 is, therefore, lower in refractive index than the passivation film 10a. At this time, t1 suffices to be larger than 380/2.0=190 nm because incident light has a wavelength of 380 nm (blue) or more. More preferably, t1 is larger than 600/2.0=300 nm with respect to 600 nm (red) which is almost the upper limit of the wavelength of incident light. t2 suffices to be smaller than 380/2.0=190 nm when the wavelength of incident light is 380 nm (blue). More preferably, t2 is equal to or larger than 30 nm and equal to or smaller than 190 nm at which the hydrogen termination as the function of the passivation film exhibits the dark current reduction effect. The light collection effect according to the first embodiment becomes more significant for a larger oblique component of incident light.

<Effects of First Embodiment>

Figure 3:
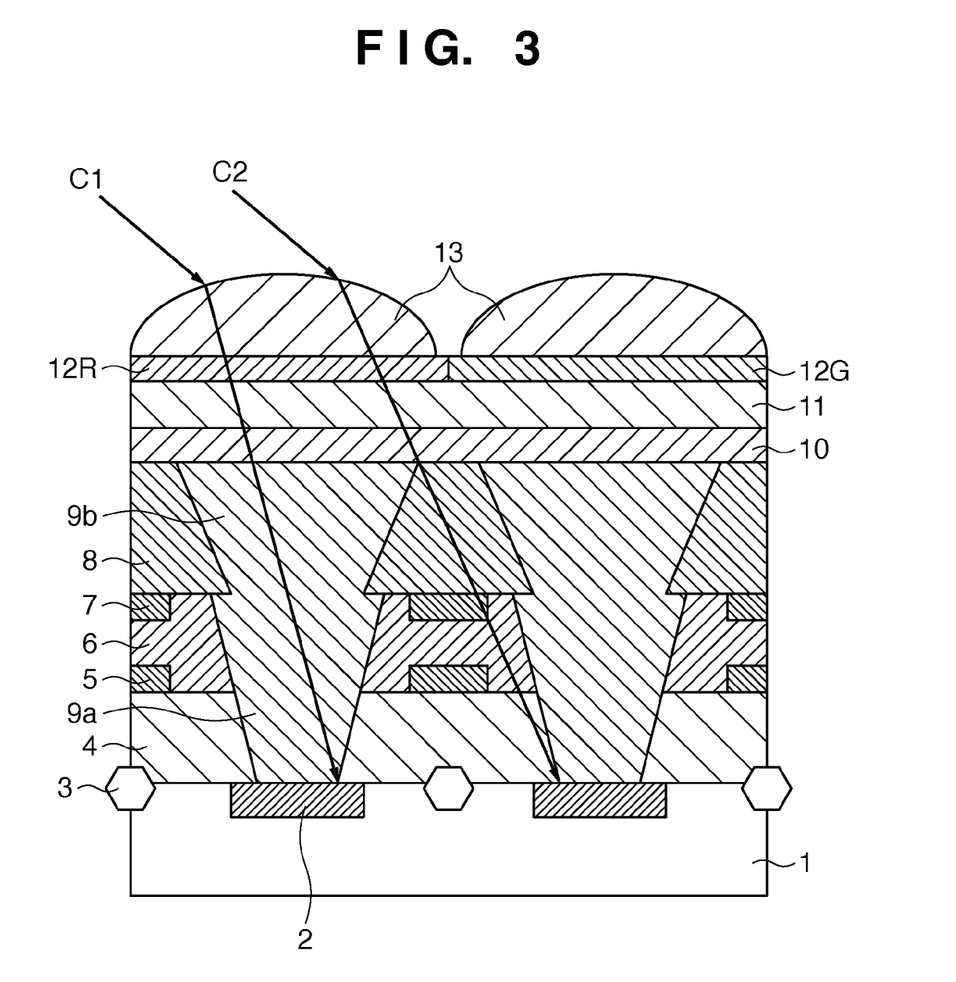
FIG. 3 is a sectional view showing the structure of a solid-state image sensor as a comparative example with respect to the solid-state image sensor according to the embodiment in FIG. 1.

FIG. 3 is a sectional view of a comparative example for explicitly explaining the effects of the photoelectric conversion element according to the first embodiment. FIG. 3 is a sectional view showing two adjacent pixels having the same structure as that of the photoelectric conversion element in the first embodiment except that a passivation film 10 is formed at a constant thickness. In the comparative example of FIG. 3, incident light C1 enters the left part of the surface of the microlens 13 while inclining to the left. This light is refracted by the microlens 13, enters the opening at the upper portion of the light waveguide 9b, and then enters the photoelectric conversion element 2. In contrast, light C2 which enters the right part of the surface of the microlens 13 while inclining to the left does not enter the opening at the upper portion of the light waveguide 9b, deviates from the light waveguide 9a, and cannot be converged. Light which is not guided to the photoelectric conversion element 2 cannot be effectively used for detection, and causes mixture of colors upon entering the photoelectric conversion element 2 of an adjacent pixel. Also, light which is not guided to the photoelectric conversion element 2 may propagate through the passivation film 10 while being reflected, and enter another photoelectric conversion element 2.

To the contrary, in the structure of the first embodiment shown in FIG. 1, not only the light beam C1 but also the incident light C2 can be guided to the opening at the upper portion of the light waveguide 9b by total reflection because of the refractive index difference between the passivation film 10a and the planarizing layer 11. After that, the incident light can be totally reflected by the side wall of the light waveguide 9a and converged to the photoelectric conversion element 2.

Even for incident light C3, the thickness of the passivation film 10b satisfies the relation t2<λ/n, so light entering the passivation film 10b from the passivation film 10a cannot propagate through the passivation film 10b. That is, the solid-state image sensor in the first embodiment can use the passivation films 10a and 10b different in thickness and the light waveguide 9 to guide, to the photoelectric conversion element, incident light which has not been converted conventionally. Further, the solid-state image sensor in the first embodiment can reduce light which may enter an adjacent pixel conventionally.

The light waveguides 9a and 9b and passivation films 10a and 10b having high refractive indices may be formed from an integral film.

Second Embodiment

Figure 5:
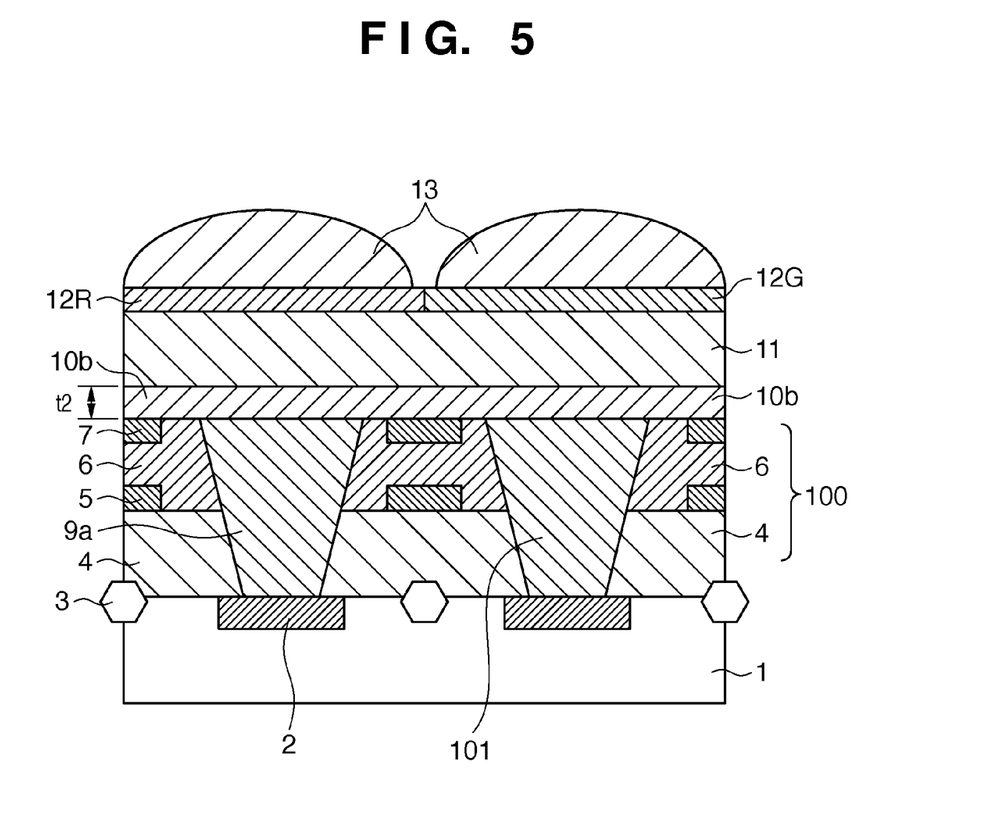
FIG. 5 is a sectional view exemplifying the structure of a solid-state image sensor according to the second embodiment.

FIG. 5 is a schematic sectional view showing a solid-state image sensor according to the second embodiment. The solid-state image sensor of the second embodiment is obtained by removing the third insulating layer 8 and the light waveguide 9b formed in the opening of the third insulating layer 8 from the solid-state image sensor of the first embodiment. In the solid-state image sensor of the second embodiment, a passivation film serving as the second insulating film is formed from a passivation film 10b which has a smooth continuous surface as an upper surface and has the thickness t2. The remaining structure is the same as that in the first embodiment. Letting t2 be the thickness of the passivation film 10b, all or at least part of the region on the upper surface of a first insulating film 100 is covered with the passivation film 10b whose thickness satisfies the relation t2<λ/n. In the example shown in FIG. 5, the upper surfaces of the first insulating film 100 and light waveguide 9a are covered with the passivation film 10b which has a smooth continuous surface as an upper surface and has the thickness t2. In the claims, this relation is described as t<λ/n by replacing t2 with t for descriptive convenience. Arranging the second insulating film, which satisfies t2<λ/n (or t<λ/n), in all or at least part of the region on the upper surface of the first insulating film 100 suppresses propagation of light which is reflected by the upper and lower surfaces of the second insulating film. This suppresses entrance of such light into a light waveguide 9a and further into a photoelectric conversion element 2, reducing mixture of colors and noise.

The light waveguide 9a and passivation film 10b having high refractive indices may be formed from an integral film. A planarizing layer 11 is not limited to a transparent polymer resin, but may be formed from an inorganic material such as silicon oxide. In the structure of the second embodiment, the upper surface of the passivation film 10b is flat, so the planarizing layer 11 may not have a planarizing function.

Third Embodiment

Figure 6:
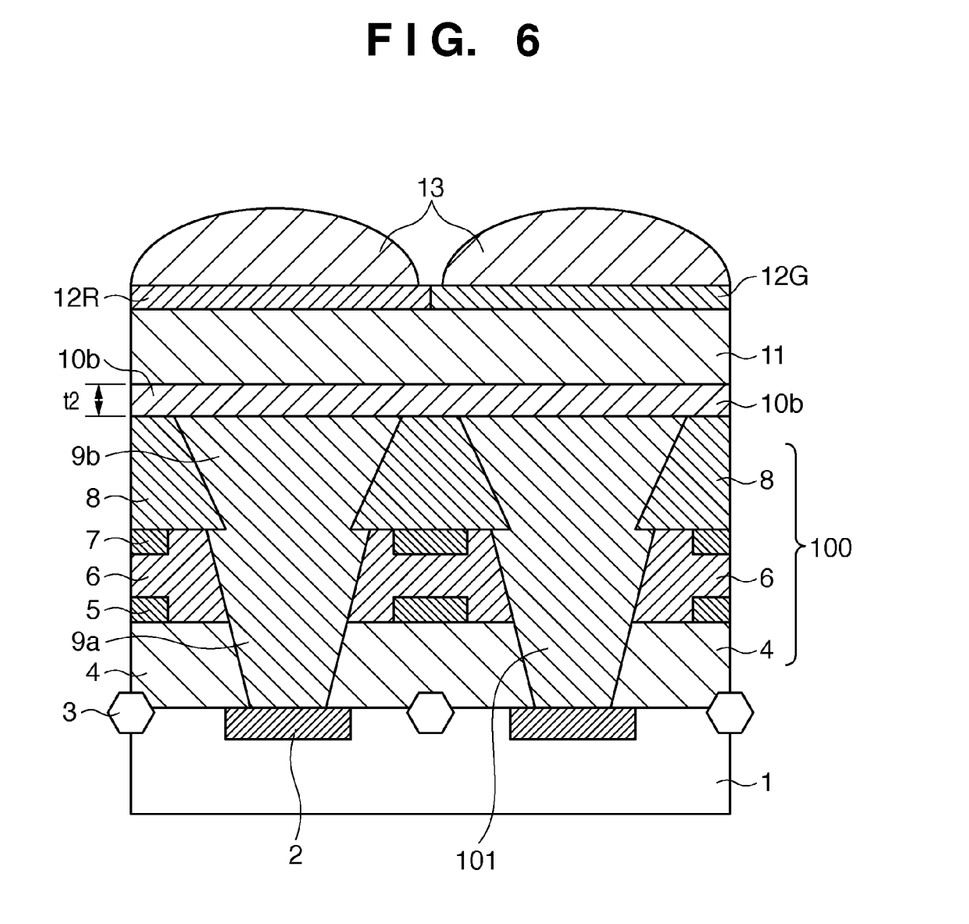
FIG. 6 is a sectional view exemplifying the structure of a solid-state image sensor according to the third embodiment.

FIG. 6 is a schematic sectional view showing a solid-state image sensor according to the third embodiment. In the solid-state image sensor of the third embodiment, a passivation film serving as the second insulating film is formed from a passivation film 10b which has a smooth continuous surface as an upper surface and has the above-mentioned thickness t2. The remaining structure is the same as that in the first embodiment. Letting t2 be the thickness of the passivation film 10b, all or at least part of the region on the upper surface of a first insulating film 100 is covered with the passivation film 10b whose thickness satisfies the relation t2<λ/n. In the example shown in FIG. 6, the upper surface of the first insulating film 100 and that of a light waveguide 9b are covered with the passivation film 10b which has a smooth continuous surface as an upper surface and has the thickness t2. In the claims, this relation is described as t<λ/n by replacing t2 with t for descriptive convenience. Arranging the second insulating film, which satisfies t2<λ/n (or t<λ/n), in all or at least part of the region on the upper surface of the first insulating film 100 suppresses propagation of light which is reflected by the upper and lower surfaces of the second insulating film. This suppresses entrance of such light into a light waveguide 9a and the light waveguide 9b and further into a photoelectric conversion element 2, reducing mixture of colors and noise.

The light waveguide 9b and passivation film 10b having high refractive indices may be formed from an integral film. A planarizing layer 11 is not limited to a transparent polymer resin, but may be formed from an inorganic material such as silicon oxide. In the structure of the third embodiment, the upper surface of the passivation film 10b is flat, so the planarizing layer 11 may not have a planarizing function.

<Example of Circuit Arrangement>

Figure 4A:
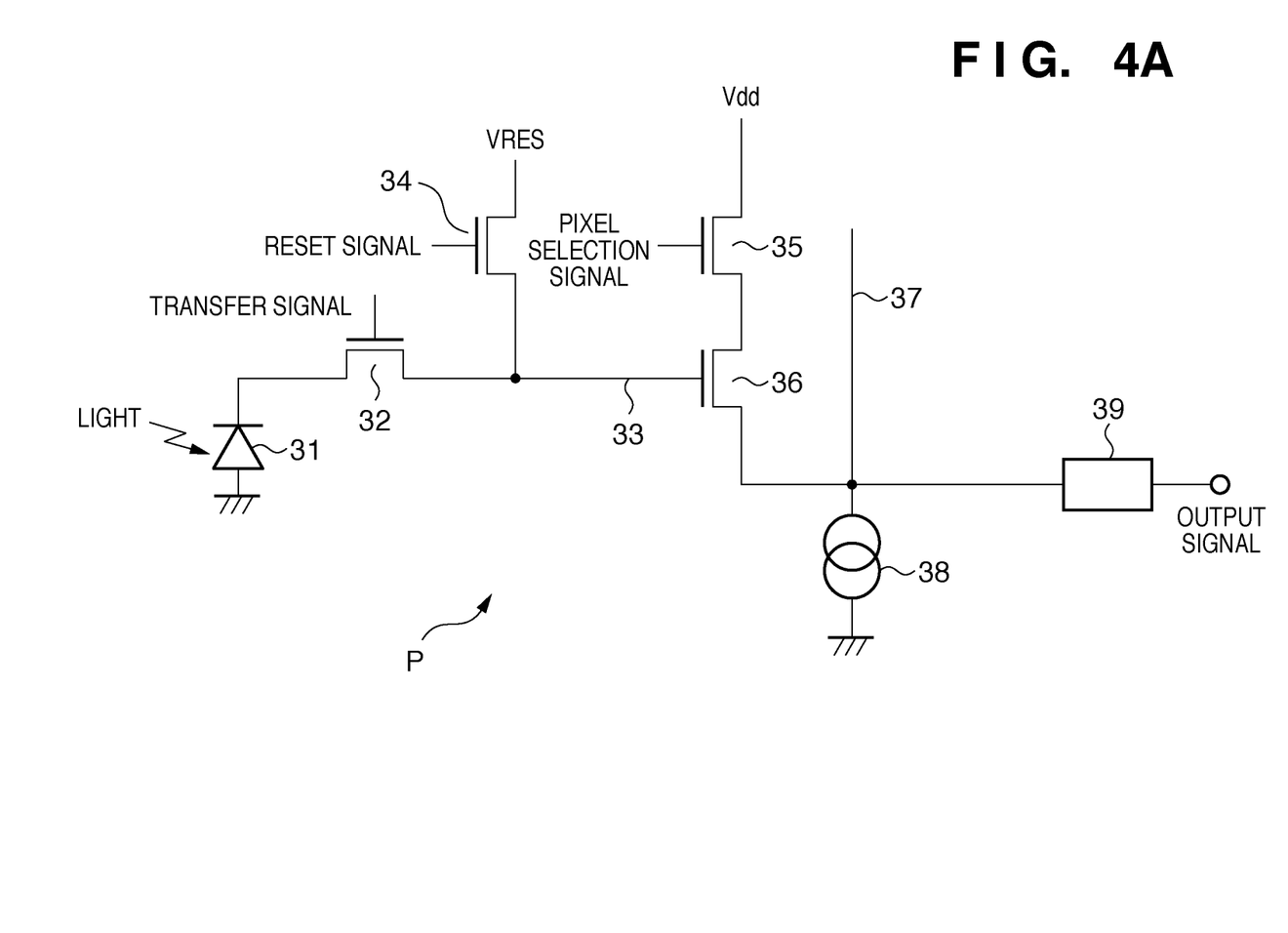
FIG. 4A is a circuit diagram exemplifying the circuit arrangement of a pixel P in a solid-state image sensor according to one of the first to third embodiments.

FIG. 4A is a circuit diagram exemplifying the typical circuit arrangement of one pixel P in a solid-state image sensor 100 according to one of the first to third embodiments. In an actual solid-state image sensor 100, pixels P are arrayed two- or one-dimensionally, and a scan circuit, readout circuit, output amplification circuit, and the like for driving a pixel are arranged around the array. In the example of FIG. 4A, the pixel P includes a photoelectric converter 31, transfer transistor 32, floating diffusion (to be referred to as an FD) 33, reset transistor 34, amplification transistor 36, and selection transistor 35.

When light enters the light receiving surface of the photoelectric converter 31, the photoelectric converter 31 generates charges (electrons in this example) corresponding to the light and stores them. The photoelectric converter 31 is, for example, a photodiode, and stores, in the cathode, charges generated by photoelectric conversion performed at the interface between the anode and the cathode. When the channel is rendered conductive (rendering the transistor conductive will be described as "turning on the transistor", and rendering the transistor non-conductive will be described as "turning off the transistor"), the transfer transistor 32 transfers charges generated in the photoelectric converter 31 to the FD 33. When the reset transistor 34 is turned on, it resets the FD 33. The amplification transistor 36 outputs a signal corresponding to the potential of the FD 33 to a vertical signal line 37 by performing a source follower operation together with a constant current source 38 connected to the vertical signal line 37. The vertical signal line 37 is connected to other pixels in the column direction and shared between a plurality of pixels. That is, when the reset transistor 34 resets the FD 33, the amplification transistor 36 outputs a noise signal corresponding to the potential of the FD 33 to the vertical signal line 37. When the transfer transistor 32 transfers charges generated in the photoelectric converter 31 to the FD 33, the amplification transistor 36 outputs an optical signal corresponding to the potential of the FD 33 to the vertical signal line 37. The selection transistor 35 selects the pixel P when it is turned on, and cancels selection of the pixel P when it is turned off. Note that when the selected state/unselected state of the pixel P is controlled based on the potential of the FD 33, the selection transistor 35 may be omitted from the pixel P and a plurality of photoelectric converters 31 may be arranged for one amplification transistor 36. For example, a readout circuit 39 reads out the signals of a plurality of pixels in the column direction along the vertical signal line 37 as a one-dimensional image sensing result or composites them with those along another vertical signal line 37 in the row direction and reads outs them as a two-dimensional image sensing result, and the solid-state image sensor outputs the result as an output signal, details of which will not be described. The reset signal, the transfer signal, and the pixel selection signal shown in FIG. 4A are examples of a signal that controls the operation of each transistor.

<Example of Configuration of Imaging System>

Figure 4B:
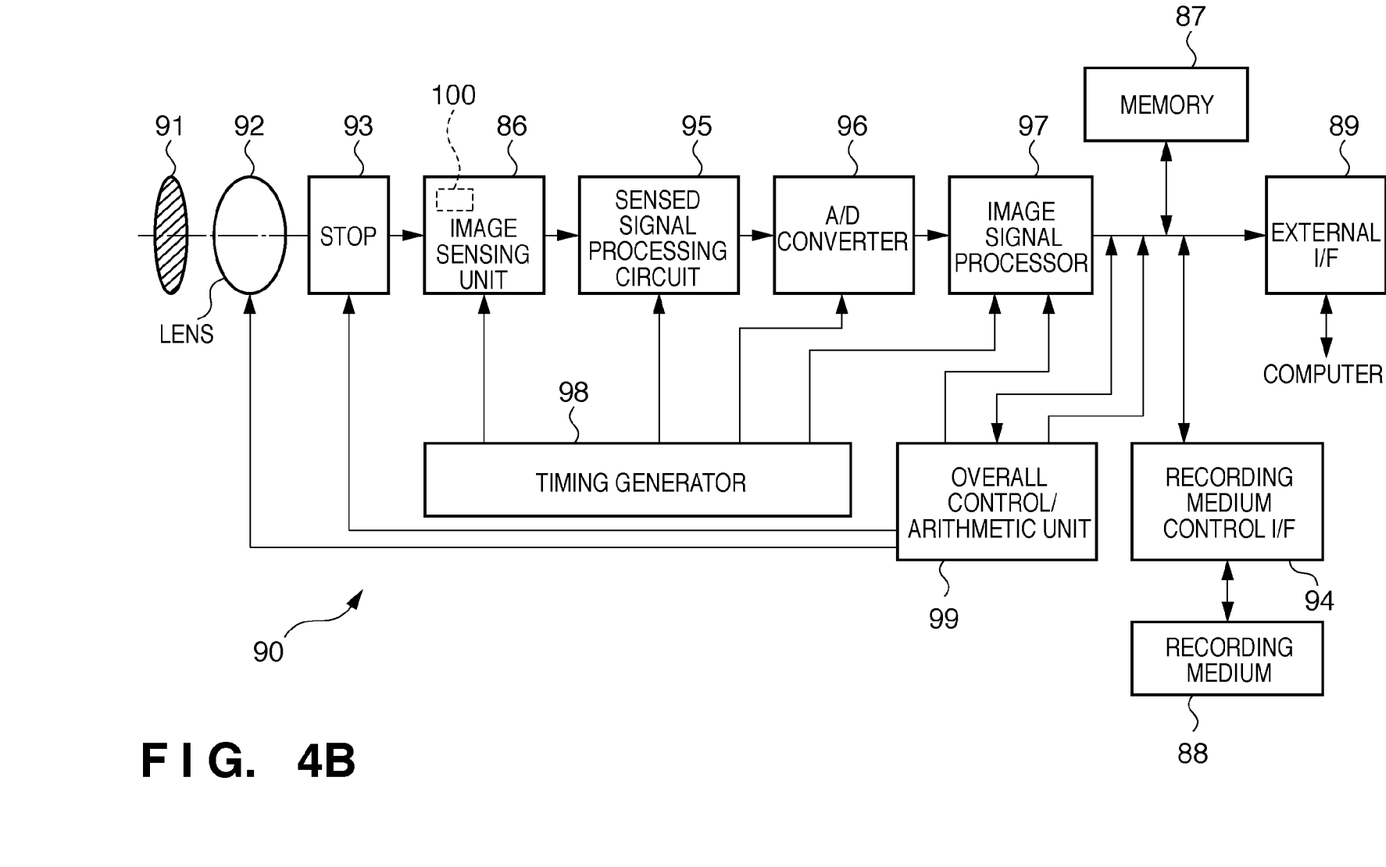
FIG. 4B is a block diagram exemplifying the configuration of an imaging system to which the solid-state image sensor according to one of the first to third embodiments is applied.

FIG. 4B exemplifies the configuration of an imaging system to which the solid-state image sensor 100 according to one of the first to third embodiments is applied. An imaging system 90 mainly includes an optical system, image sensing unit 86, and signal processing unit. The optical system mainly includes a shutter 91, lens 92, and stop 93. The image sensing unit 86 includes the solid-state image sensor 100 of the embodiment. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88. The shutter 91 is arranged in front of the lens 92 on the optical path to control the exposure. The lens 92 refracts incident light to form an object image on the image sensing surface of the solid-state image sensor 100 of the image sensing unit 86. The stop 93 is interposed between the lens 92 and the solid-state image sensor 100 on the optical path. The stop 93 adjusts the quantity of light guided to the solid-state image sensor 100 after the light passes through the lens 92.

The solid-state image sensor 100 of the image sensing unit 86 converts an object image formed on the image sensing surface of the solid-state image sensor 100 into an image signal. The image sensing unit 86 reads out the image signal from the solid-state image sensor 100, and outputs it. The sensed signal processing circuit 95 is connected to the image sensing unit 86, and processes an image signal output from the image sensing unit 86. The A/D converter 96 is connected to the sensed signal processing circuit 95. The A/D converter 96 converts a processed image signal (analog signal) output from the sensed signal processing circuit 95 into an image signal (digital signal). The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like. The memory 87 is connected to the image signal processor 97, and stores image data output from the image signal processor 97. The external I/F 89 is connected to the image signal processor 97. Image data output from the image signal processor 97 is transferred to an external device (for example, a personal computer) via the external I/F 89.

The timing generator 98 is connected to the image sensing unit 86, sensed signal processing circuit 95, A/D converter 96, and image signal processor 97. The timing generator 98 supplies timing signals to the image sensing unit 86, sensed signal processing circuit 95, A/D converter 96, and image signal processor 97. The image sensing unit 86, sensed signal processing circuit 95, A/D converter 96, and image signal processor 97 operate in synchronism with the timing signals. The overall control/arithmetic unit 99 is connected to the timing generator 98, image signal processor 97, and recording medium control I/F 94, and controls all of them. The recording medium 88 is detachably connected to the recording medium control I/F 94. Image data output from the image signal processor 97 is recorded on the recording medium 88 via the recording medium control I/F 94.

With this arrangement, the solid-state image sensor 100 can provide a high-quality image (image data) in the imaging system as long as it can obtain a high-quality image signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-088192, filed Apr. 6, 2010 and No. 2011-026532, filed Feb. 9, 2011, which are hereby incorporated by reference herein in their entirety.

What is claimed is:

1. A solid-state image sensor including a semiconductor substrate containing a plurality of photoelectric conversion elements, the sensor comprising:
   a first insulating film arranged on the semiconductor substrate and having a plurality of openings, each of the plurality of openings being arranged on one of the plurality of photoelectric conversion elements;
   a plurality of insulator portions having a refractive index higher than a refractive index of the first insulating film, each of the plurality of insulator portions being arranged in one of the plurality openings;
   a second insulating film arranged on upper surfaces of the plurality of insulator portions and on an upper surface of the first insulating film;
   a third insulating film having a refractive index lower than a refractive index of the second insulating film, the third insulating film being arranged on an upper surface of the second insulating film; and
   a color filter arranged above the third insulating film,
   wherein, letting λ represent a wavelength of light entering the plurality of insulator portions, n represent the refractive index of the second insulating film, and t represent a thickness of the second insulating film in at least part of a region on the upper surface of the first insulating film, a relation $t < \lambda/n$ is satisfied.

2. The sensor according to claim 1, wherein the upper surface of the second insulating film is a smooth continuous surface.

3. The sensor according to claim 1, wherein each of the plurality of openings has a tapered shape in which an area increases with distance from the photoelectric conversion element.

4. The sensor according to claim 1, wherein the second insulating film and the plurality of insulator portions are formed from one of silicon nitride and silicon oxynitride.

5. The sensor according to claim 1, wherein at least part of the plurality of insulator portions and the second insulating film are integrated.

6. The sensor according to claim 1, wherein the sensor is incorporated in an imaging system that includes a signal processor configured to process a signal obtained by the sensor.

7. The sensor according to claim 1,
   wherein, letting t1 represent a thickness of the second insulating film in at least part of a region on the upper surfaces of the plurality of insulator portions, a relation $t1 > \lambda/n$ is further satisfied.

8. A solid-state image sensor including a semiconductor substrate containing a plurality of photoelectric conversion elements, the sensor comprising:

a first insulating film arranged on the semiconductor substrate and having a plurality of openings, each of the plurality of openings being arranged on one of the plurality of photoelectric conversion elements;

a plurality of insulator portions having a refractive index higher than a refractive index of the first insulating film, each of the plurality of insulator portions being arranged in one of the plurality openings;

a second insulating film arranged on upper surfaces of the plurality of insulator portions and on an upper surface of the first insulating film; and a third insulating film having a refractive index lower than a refractive index of the second insulating film, the third insulating film being arranged on an upper surface of the second insulating film, wherein, letting $\lambda$ represent a wavelength of light entering the plurality of insulator portions, n represent the refractive index of the second insulating film, and t represent a thickness of the second insulating film in at least part of a region on the upper surface of the first insulating film, a relation $t<\lambda/n$ is satisfied, and wherein, letting t1 represent a thickness of the second insulating film in at least part of a region on the upper surfaces of the plurality of insulator portions, a relation $t1>\lambda/n$ is further satisfied.

9. The sensor according to claim 8, wherein the sensor is incorporated in an imaging system that includes a signal processor configured to process a signal obtained by the sensor.

* * * * *